United States Patent [19]
Kalnin et al.

[11] Patent Number: 4,788,096
[45] Date of Patent: Nov. 29, 1988

[54] DEVICES FOR MAKING PIEZOELECTRIC CERAMIC OR CERAMIC-BASE COMPOSITE SENSORS

[75] Inventors: Ilmar L. Kalnin, Millington; Howard Furst, Berkeley Heights; George J. Breckenridge, Clark; O. Richard Hughes, Chatham Township, Morris County, all of N.J.

[73] Assignee: Hoechst Celanese Corporation, Somerville, N.J.

[21] Appl. No.: 18,210

[22] Filed: Feb. 24, 1987

Related U.S. Application Data

[62] Division of Ser. No. 741,925, Jun. 6, 1985, abandoned.

[51] Int. Cl.$^4$ .................. B32B 3/20; C04B 35/00; G04F 5/00
[52] U.S. Cl. .................... 428/188; 252/62.9; 367/157; 84/DIG. 24
[58] Field of Search ............... 428/188; 252/62.9; 264/61; 84/DIG. 24; 367/157

[56] References Cited

U.S. PATENT DOCUMENTS

| | | | |
|---|---|---|---|
| 738,423 | 9/1903 | Durant . | |
| 2,305,877 | 12/1942 | Klingler et al. | 25/3 |
| 2,919,483 | 1/1960 | Gravley | 25/156 |
| 3,209,057 | 9/1965 | Lassman | 264/109 |
| 3,830,458 | 8/1974 | Hamblin | 249/50 |
| 4,023,769 | 5/1977 | Andrews, Jr. | 249/64 |
| 4,050,188 | 9/1977 | van Wingarden | 47/85 |
| 4,052,034 | 10/1977 | Marceno | 249/110 |
| 4,402,894 | 9/1983 | Nemeth et al. | 264/56 |
| 4,422,003 | 12/1983 | Safari et al. | 310/358 |
| 4,532,152 | 7/1985 | Elardo | 427/96 |
| 4,624,796 | 11/1986 | Giniewicz et al. | 252/62.9 |
| 4,628,223 | 12/1986 | Takeuchi et al. | 310/358 |

OTHER PUBLICATIONS

"Hinged Hydrostatic Transducers", Final Report to the Office of Naval Research on Contract No. N00014-82-0072, Task II., by Gordon O. Dayton et al, pp. 1-13, 21-23, and 70-72.

"Piezoelectric Polymer Flexural Disk Hydrophone", T. D. Sullivan and J. M. Powers, Naval Underwater Systems Center, New London Laboratory, New London, Connecticut, 06320.

"Properties of PVDF Polymer for Sonar", R. H. Trancrell, D. T. Wilson and D. Ricketts, *Proceedings of the IEEE Ultrasonic Symposium*, Catalogue #85 CH 2209-5, pp. 624-629, (1985).

"Procedures for Comparing Hydrophone Noise with Minimum Water Noise", Ralph S. Woollett, Naval Underwater Systems Center, New London Laboratory, New London, Connecticut, 06320.

*Primary Examiner*—John E. Kittle
*Assistant Examiner*—Patrick J. Ryan
*Attorney, Agent, or Firm*—Depaoli & O'Brien

[57] ABSTRACT

Cubelets are made from a piezoelectrically active ceramic material having holes therein which may be cross-cored. The holes are selectively filled with a liquid curable resin, such as an epoxy. The cubelets may also be formed from bonded or sintered "half-shapes" containing half cores, wherein a face bisects one hole or an array of holes or cross-cored holes to form one or an array of semicircular grooves or crossed semicircular grooves. The cubelets, whether filled with resin or having unfilled internal volume, are arranged in a precision array within the snug-fitting cavities of a lattice, whereby the holes are sealed off, to form a cubelet/lattice assembly which is then electroded and poled in an electric field and encapsulated in polymer to form a part of a hydrophone assembly, for example.

15 Claims, 2 Drawing Sheets

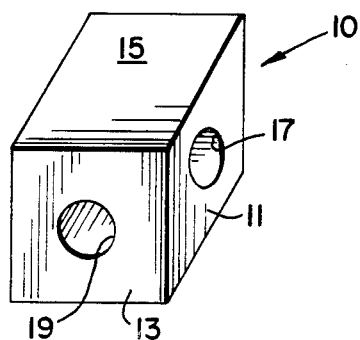
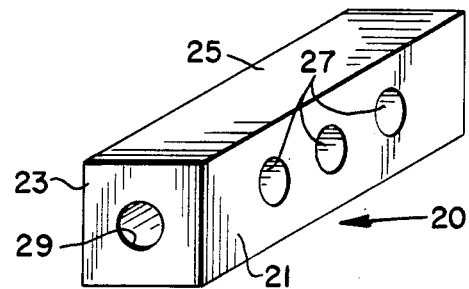
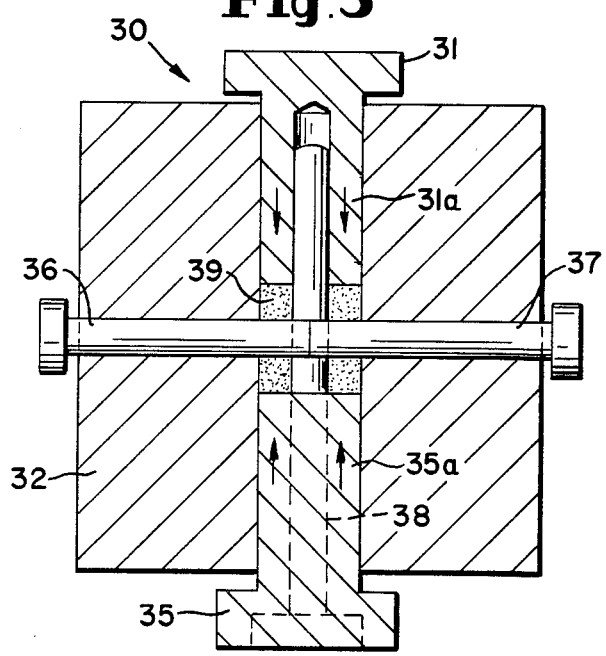
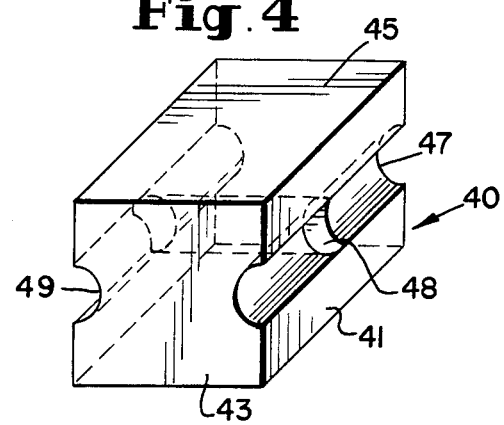
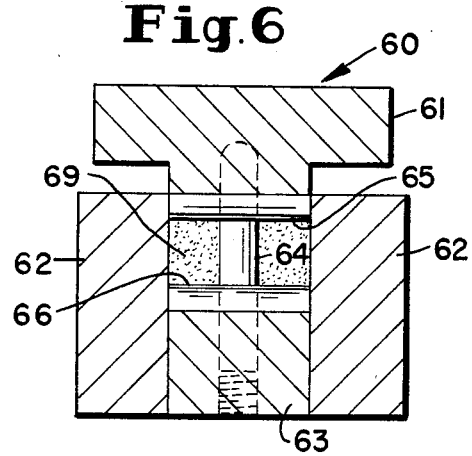
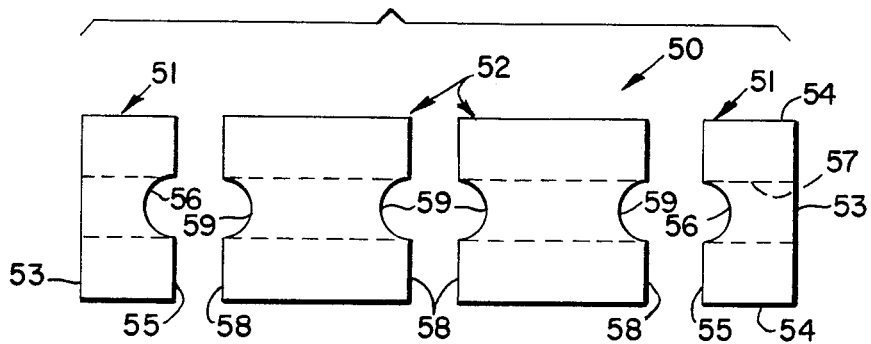

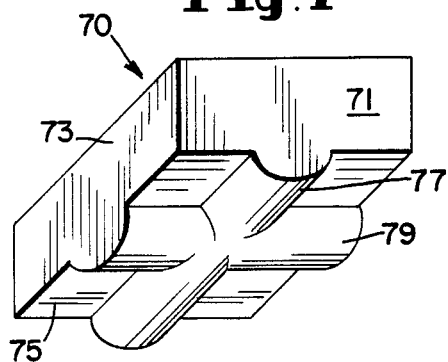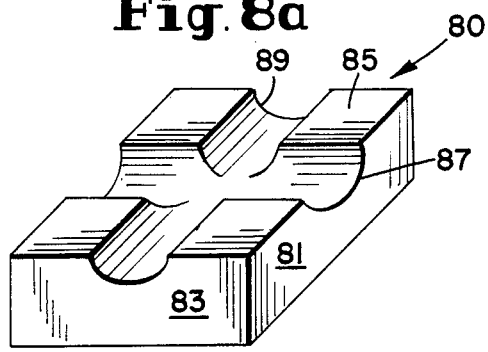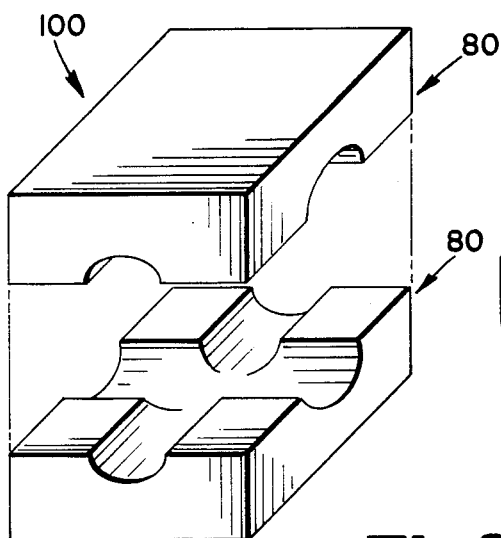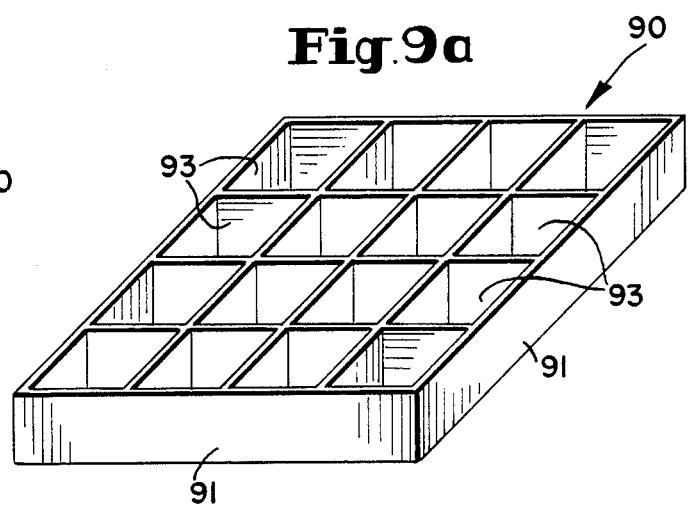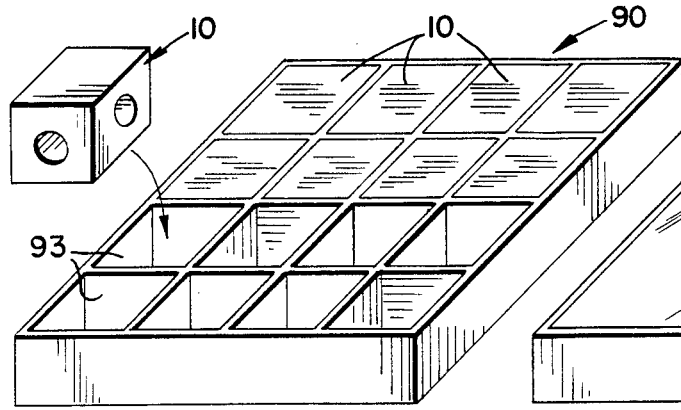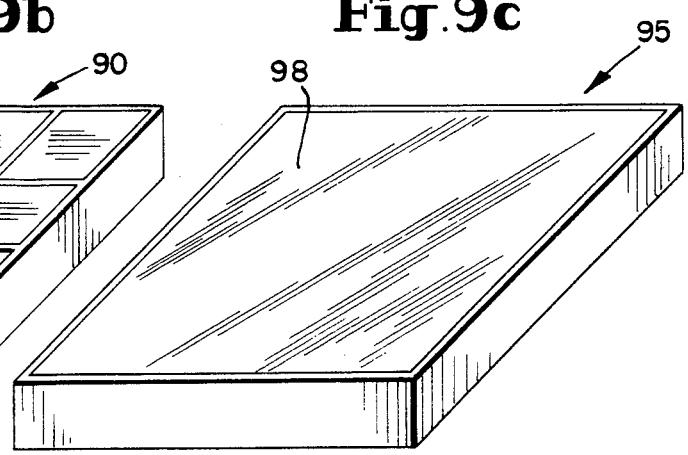

DEVICES FOR MAKING PIEZOELECTRIC CERAMIC OR CERAMIC-BASE COMPOSITE SENSORS

This application is a division of application Ser. No. 741,925 filed June 6, 1985 now abandoned.

BACKGROUND OF THE INVENTION

1. Field of the Invention

This invention relates to piezoelectric materials and especially relates to 3-1 and 3-2 phase connected composites of piezoelectric ceramics and polymers for use as pressure, sound, and vibration sensors and electromechanical transducers. It especially relates to the fabrication by molding of intricate, functional shapes of such composites with uniform and reproducible density and the assembly of composite elements into precision arrays.

2. Review of the Prior Art

A variety of electro-mechanical transducers such as hydrophones, air sensors, vibration sensors, pressure and stress sensors depend on the piezoelectric phenomenon exhibited by certain piezoelectric crystals, polarized ceramics, and polarized polymers.

An important class of prior art sensors have as their active sensing element solid shapes of piezoelectric ceramic materials. In the particularly important hydrophone application area, the piezoelectrically active ceramic component converts underwater sound pressure waves to electrical signals which are then amplified and displayed. In recent years large numbers of sensors have come to be used in wide aperture arrays of individual sensors.

The solid shapes are fabricated from piezoelectric ceramic powders by a variety of standard consolidation techniques. Electrodes are bonded to two opposing faces in order to polarize the piezoelectric material during fabrication and to sense the electrical signals that develop in the material in use. Lead zirconate titanate compositions, which are collectively referred to as PZT materials, are widely used because transducers based on these materials exhibit moderate sensitivity and durability. Solid shapes in the forms of cubes, plates, tubes, and arrays thereof are commonly employed.

The detecting sensitivity of such prior art dense solid piezoelectric ceramics (piezo-ceramic) sensors, however, is modest. The sensitivity of a sound receiver material is commonly characterized by a hydrophone Figure of Merit or FOM. The FOM is defined as the product of two hydrostatic piezoelectric coefficients—the charge coefficient, $d_h$, and the voltage coefficient, $g_h$. For conventional PZT-based piezo-ceramics $d_h$ typically has values of about $50-60 \times 10^{-12}$ Coulombs/Newton (C/N) and $g_h$ has values of about $2-3 \times 10^{-3}$ volt$\times$meter/Newton (Vm/N) to give FOM values in the $100-200 \times 10^{-15}$ m$^2$/Newton (m$^2$/N) range.

A more sensitive hydrophone element is described in U.S. Pat. No. 4,422,003 wherein PZT shapes (cubelets) are fabricated having holes in the PZT parallel to, and between, the electroded surfaces. The holes are filled with a liquid polymer resin which is solidified in place. The result is described as a piezo-ceramic polymer composite with 3-1 or 3-2 connectivity. In this nomenclature for the connectedness of biphasic composites, "3" refers to the fact that the ceramic phase is self-connected along all three cartesian coordinates of the specimen, while "1" and "2" refer to self-connectivity of the polymer phase along one or two coordinates, respectively.

According to this disclosure, biphasic composites with 3-1 and 3-2 connectivity exhibit relatively high hydrostatic piezoelectric voltage ($g_h$) coefficient and hydrophone FOM values. FOM values over $10,000 \times 10^{-15}$ m$^2$/N are observed. The presence of the 3-1 and 3-2 connectivities is chiefly responsible for the improved hydrophone FOM values.

In addition, other piezoelectric voltage coefficients, such as $g_{33}$, are much higher from composites than from solid PZT elements.

Still further, the density of these composites is lower (4–5 g/cm$^3$) than that of solid PZT (ca. 8 g/cm$^3$). The lower density of the composites results in a better acoustical coupling of the transducer to the sound-transmitting water phase.

The most successful 3-2 shape described in this patent is a cubelet, of approximately 9/32 inch along each edge, with two circular tunnels, approximately 5/32 inch in diameter, joining the opposite faces. The tunnels contain a high compliance solid polymer, such as epoxy, bonded well to the ceramic walls. A typical 3-1 composite, which has a lower FOM, is a similar cubelet with only one resin-filled hole or a parallel plurality thereof.

The PZT-polymer composites are prepared according to this patent by conventional means, including cold pressing, sintering, manually drilling out the transverse cores ultrasonically, and filling them with a liquid epoxy or other curable resin. Such a fabrication process is slow and costly because most sintered specimens fracture during the ultrasonic drilling of the second core or row of cores. Consequently, it is unsuitable for the production of a large number of such composites which must be dimensionally identical and free of defects in order to be assembled into advanced multisensor-containing arrays. There is accordingly a need for a simple and easily reproducible process for making the PZT-polymer composites in a reproducible and rapid manner without fracturing thereof during manufacture.

U.S. Pat. No. 738,423 discloses a method for casting cored pieces such as building blocks by utilizing a mold with removable cores. Openings are provided in the flask for coring in two directions, but cross-coring, i.e., molding two intersecting through holes into the specimen transverse to the pressing axis, which provides the highest FOM values in a piezoelectric material, is not considered.

U.S. Pat. No. 2,305,877 describes a method for producing spark plug insulators, wherein a ceramic mateial is molded by utilizing a plunger and a needle. The injected ceramic material surrounds the needle within the mold so that the needle simultaneously produces one central bore and the thread in the head of the insulator.

U.S. Pat. No. 2,919,483 discloses a method for forming a ceramic capacitor having a plurality of longitudinally extending holes in the form of thin slices therein. The method utilizes a pool of mercury in a tank having a dividing wall that extends beneath the mercury surface, a liquid coagulating agent being floated on the mercury on one side of the dividing wall and an aqueous dispersion of ceramic raw material being floated on the other side of the dividing wall. The process comprises passing a plurality of unrefractory thin strips successively through the coagulating agent, the mercury, and the aqueous ceramic dispersion, compressing the strips together, heating the compressed strips to remove much of the moisture from a newly formed green ceramic body, and firing the resulting structure to eliminate the unrefractory strips, which may be parchment paper about 0.003 inch thick and ¼ inch wide.

U.S. Pat. No. 3,830,458 describes a mold for the casting of concrete articles which may be easily opened and then accurately reassembled without being damaged by relative movement with the mold sides.

U.S. Pat. No. 4,023,769 discloses a method for molding concrete slabs which utilizes opposed core members during the molding operation. The core members do not meet, thereby producing a concrete slab having a web rather than core. If it is desired to form communicating openings in the central web of the slab, additional core members may be provided on the inner end or ends of the core members which may be of any desired shape or size, thereby forming round openings for pipes or long narrow openings for heating or air conditioning ducts. These concrete slabs are used to form large building slabs suitable for either walls or floors, having longitudinal transverse webs of great structural strength and yet capable of being molded substantially to any desired size, thickness, and length.

U.S. Pat. No. 4,402,894 describes a method for molding a ceramic resistor utilizing a circular mold with vertically opposed plungers, compaction being provided only by the upper plunger, and the lower plunger being used only for ejecting the molded article, such as a ceramic resistor blank. The method particularly discloses the use of a stationary resilient finger and means mounting the finger so that a sharp rotational movement is imparted to the plunger relative to the pressed blank as the applied pressure thereon is being released, thereby providing a shearing action which insures a clean separation of the blank from the plunger.

In the Final Report to the Office of Naval Research on Contract No. N00014-82-G-0072 TaskII, entitled "Hinged Hydrostatic Transducers", a method of arranging a plurality of composite cubelets in an array to increase the sensing area of a transducer and its sensitivity is discussed and evaluated. The cubelets were manually arranged in the desired array and set in place with a curable resin such as a polyurethane or epoxy resin. To precisely arrange large numbers of cubelets requires skill and attention and is therefore only practical when small numbers of arrays are required.

Fixing the cubelets in place by setting the array in a resin entails working with resins, curing agents, and curing cycles and requires special skills which are not necessarily available in an assembly line environment.

Finally, the rigidity of the potting material of the array affects the performance of the array as a hydrophone. Highest FOM's result when the holes in the cubelets are sealed from the environment by stiff plates. When more compliant sealing materials are used, the transverse hydrostatic pressures are converted in accordance with Poisson's ratio effects to longitudinal stresses in the cubelet which oppose the pressure being measured. The result is a hydrophone that is less sensitive and which has a response that is static pressure dependant.

For these reasons the prior art approach is only practical when a few arrays are to be assembled and where high sensitivity and static pressure limitations are not a concern.

A means must be provided to simplify the process.

SUMMARY OF THE INVENTION

It is an object of the invention to provide a manufacturing-oriented method for forming multi-cored ceramic or ceramic/polymer composite articles.

It is another object to provide a molding method for producing cross-cored ceramic shapes.

It is a further object to provide a molding method for producing cross-cored cubelets of 3-1 and 3-2 connectivities for manufacturing piezoelectric ceramic or ceramic-base composite sensors having very high hydrophone Figure-of-Merit values.

It is an additional object to provide a method of mounting large numbers of cubelets in precision arrays for subsequent use in transducer fabrication.

In accordance with the principles of this invention and the foregoing objects, methods are herein provided for molding piezoelectric ceramic green composites, having unidirectionally cored holes or cross-cored holes therein, from piezoelectric ceramic material and a polymer or binder in powder or liquid form.

The holes may be disposed as an array of parallel holes to form a unidirectionally-cored 3-1 composite. The holes may also form two sets of parallel but intersecting holes to form a cross-cored 3-2 composite. The simplest 3-1 composite is a cubelet with one hole. The simplest 3-2 composite is a cubelet with two holes which intersect at a 90° angle in the center of the cubelet.

In one embodiment, unitary cubelets with holes are fabricated from ceramic powder by compression in a mold.

In another embodiment, mated cubelets with holes are formed from ceramic pieces which are compression molded with channels that form the holes when mated and bonded to complementary pieces.

Finally a lattice is described that facilitates the assembly of a large number of cubelets in a precision array and which forms a permanent and effective part of transducers using the cubelets.

1. Mold for Cross-Cored Cubelets

The process of this invention for molding piezoelectric ceramic green composites, which are selectively cross-cored and are to be used for making unitary transducers, comprises the following steps:

A. providing a rigid mold, comprising:
(1) a mold cavity,
(2) bidirectional core pins extending through the cavity in first and second directions and disposed at 90° to each other, and
(3) a means for transmitting axial compressive motion from a press and upon the cavity along the first direction and from opposite ends of the core pin which is aligned with the first direction;

B. adding a charge of ceramic polymer composite to the mold cavity, this charge comprising a piezoelectric ceramic and a polymer or binder in powder form or as a liquid absorbed on the surface of the ceramic; and C. compressing the charge from opposite sides thereof to form a cross-cored green composite having cross-cored holes therein.

To form a cross-cored piezoelectric ceramic-based composite transducer of unitary type, the following additional steps are used:

D. burning out the binder from the green composite, at temperatures in the range of 400°–600° C.;

E. sintering the green composite, at temperatures of 1000°–1300° C.;

F. filling the cross-cored holes with a liquid polymeric resin;

G. curing the resin to form a piezoelectrically active composite; and

H. electroding and poling the piezoelectrically active composite to form the transducer.

Alternately, step H may be undertaken before steps F and G, if desirable.

To form the mated cross-cored ceramic/polymer composite cubelet or its multiple, steps E and D are omitted, since the polymer remains as an integral part of the piezoelectric cubelet. Also, as a modification, the filling of the holes with a liquid-curable polymer (steps F and G) may be dispensed with as the holes may be filled with plugs of cured polymer.

Molding by compression is preferably done in a platen press at room temperature. The mold design must allow both the top and bottom plungers or dies to move toward each other in order that consolidation will occur both from top and bottom and provide the desired uniform density before as well as after sintering. The charge may be pre-weighed to provide a density for the green composite of approximately 4.5–5.5 g/cm$^3$. If a polymer is used, the charge comprises a powdered piezoelectric ceramic such as lead zirconate titanate (PZT) or its alloys, barium titanate and the like, and a polymer matrix which is between 30 and 100 volume percent of the ceramic.

Suitable matrix polymers are thermoset resins, such as amine- or anhydride-cured epoxy resins; thermoplastics, such as polypropylene, fluorocarbons, or polyesters; elastomers, such as sulfur- or peroxide-cured ethylene propylene diene monomer (EPDM) or chloroprene (Neoprene TM) rubbers.

If a binder is used, the charge comprises a powdered piezoelectric ceramic coated with 2–10 vol. % of a selected binder. Normally, polyvinyl alcohol (PVA) is used, but numerous other commercially available polymeric binders, such as polyvinyl butyral, polystyrene, acrylonitrile-polyester, polyacrylamide, etc. or combinations thereof are also suitable.

In the preferred approach, the piezoelectric ceramic powder is dispersed in an aqueous solution of the PVA or other binder. This dispersion is then spray dried, producing a binder-coated ceramic powder which is used as the charge to the mold cavity. The green density of the green composites has been found to be both characteristic and reproducible.

In the alternative composite variant for making mated cubelets, where the polymer is retained in the final product as a matrix, the charge may be prepared by (1) coating the ceramic powder with a polymer from a solution containing the dissolved polymer followed by removal of the solvent, e.g. by spray drying as above, or (2) intimately compounding the ceramic powder with the liquid or molten polymer in a commercial mixer (e.g. a Banbury type mixer) at room temperature or elevated temperatures.

With the mold assembled, the preferred procedure is to fill the mold cavity with a pre-weighed amount of ceramic polymer charge or of binder-coated ceramic charge, the ceramic typically having a mean particle size of 1–5 micrometers. The composition and the amount of polymer or binder must be such as to assure sufficient adhesion of the ceramic particles so that the pressed green composites have sufficient strength to be readily removed from the mold and subsequently handled in preparation for further processing.

Proper mold disassembly is important in order to preserve the green composite in good condition. The preferred procedure is as follows: (a) remove upper plunger, (b) pull out side pins, (c) use a pushrod to push out the lower pin assembly, and finally, (d) shear the green composite, as a cored cubelet, for example, off the vertical pin.

2. Molds for Cubelet Subunits

Single-core and cross-core mated cubelets can be fabricated from mated components. Each component has fewer holes than the assembled cubelet. In each case the assembled cubelet has one or more holes that are formed when mating subunits are joined. This has practical value because components having fewer holes can be fabricated by compression molding with greater speed and simplicity.

A subunit can have one hole and two channels, for example, that are formed in the mold. Additional holes are formed when two or more of these subunits are joined by adhesively mating their sides that intersect the channels. The result is a mated cross-core 3-2 composite that is fabricated from subunits having only one hole. Furthermore the hydrophone FOM value of such assemblies is substantially the same as that of unitary cubelets because the stress-bearing columns are similar.

A subunit can also be fabricated with no holes but with two intersecting channels on one surface. For example, two identical subunits can be joined to form a cross-cored 3-2 cubelet, if the channels are symmetrically deployed on the face of the subunit. The subunits can be joined by fusing in an elevated temperature sintering process or by bonding with an adhesive. Since the subunits have no holes that must be formed in the molding step and since only one subunit mold is required, this is a very simple, practical approach.

3. Lattice Arrays

To fabricate a hydrophone, a plurality of cubelets must be arranged in a precision array. Typically, 16-element and 25-element arrays have been fabricated in 4×4 and 5×5 arrangements, but larger or smaller arrays can be useful. A lattice is preferably provided in order to arrange the cubelets manually in a precision array, embed the array in liquid polymer resin, and cure the polymer in place. The lattice also seals off unfilled internal cubelet volume that has not been backfilled with polymer because the cavities in the lattice are designed to accept cubelets with a snug fit. Alternatively, the sides and bottoms of the cubelets can be glued to the framework of the lattice. In either embodiment, the cubelet/lattice ensemble is electroded and poled in an electric field and then incorporated into a hydrophone assembly.

BRIEF DESCRIPTION OF THE DRAWINGS

FIG. 1 is an isometric view of a cross-cored ceramic composite of cubelet form and with a transversely disposed hole centered in two of its visible faces so that these holes intersect perpendicularly to each other in the center of the cubelet.

FIG. 2 is an isometric view of a cross-cored ceramic composite having a single longitudinal hole and an array of transverse holes within two of its visible faces.

FIG. 3 is a sectional elevational view of a mold for making cross-cored ceramic composites in cubelet form.

FIG. 4 is an isometric view of a cross-cored ceramic composite in cubelet form, having two of its faces bisecting parallel holes aligned in one direction to form a pair of half holes, with a transversely disposed hole intersecting the half holes.

FIG. 5 is an elevational view of a group of ceramic composites, comprising inner composites or subunits having two faces bisecting parallel holes and outer composites or subunits having one face bisecting one hole in parallel with the other semicircular grooves; the inner composites and the outer composites are to be joined together either with a cement or by heat lamination along their bisecting faces.

FIG. 6 is a sectional elevational view of a mold for forming a cross-cored inner composite or subunit as shown in FIG. 4 and the inner composites or subunits of FIG. 5.

FIG. 7 is an isometric view of a male die for making cross-cored mated composites having one face bisecting both holes.

FIG. 8a is an isometric view of the lower half of a cross-cored ceramic composite having one face which bisects both holes made with the die of FIG. 7.

FIG. 8b is an isometric view of both halves, in mating position, of a cross-cored ceramic composite, each half having its mating face bisecting both holes made with the die of FIG. 7.

FIG. 9a is an isometric view of a 4×4 lattice having an array of square slots or cavities, each of which is of a size to accept a cubelet with a snug fit.

FIG. 9b is an isometric view of the lattice of FIG. 9a after it has been half filled with eight cubelets, as the next cubelet is about to be emplaced in one of the remaining empty cavities.

FIG. 9c is an isometric view of the completed cubelet/lattice assembly of FIG. 9b after it has been encapsulated in polymer.

DESCRIPTION OF THE PREFERRED EMBODIMENTS

The 3-2 piezoelectric ceramic composite 10 in cubelet form that is shown in FIG. 1 has three faces 11, 13, 15 that are visible, hole 17 being transversely disposed to face 11 and hole 19, as a cross-core, being transversely disposed to face 13

In FIG. 2, a similar 3-2 piezoelectric ceramic composite 20 is shown in rectangular form. It has three visible faces 21, 23, 25, an array of circular holes 27 which are transversely disposed to face 21, and a hole 29, as a cross-core to the array of holes 27, which is transversely disposed to face 23.

The mold 30 that is shown in FIG. 3 is suitable for use in a conventional press, such as a platen press. It comprises a frame 32, a top die 31 that slides therewithin, and a bottom die 35 that also slides within frame 32 to compress a composite charge placed in mold cavity 39 between dies 31, 35. Two cross pins 36, 37 pass through the mold frame 32 on opposite sides. These have grooved tips so as to fit snugly around a vertical pin 38 which passes through bottom die 35 and enters a blind hole within the top die 31. The compression may be initially exerted by bottom die 35 in the direction shown by arrows 35a, shortly before compression begins to be exerted by top die 31 in direction 31a, or alternately equal compressive loads must be exerted by both dies 35 and 31 in order to provide a uniformly compacted green ceramic composite having sharply defined boundaries with respect to its cross-cored holes.

When molding is complete, mold 30 is disassembled by opening the platen press and lifting die 31 out of contact with frame 32, sidewardly removing horizontal cross pins 36 and 37, and then removing the "green" composite shape made from the charge in mold cavity 39 together with pin 38 and, as the final step, carefully removing the green composite from pin 38 without breakage thereof.

In FIG. 4, a semicircularly grooved piezoceramic composite is shown which has three visible faces 41, 43, and 45, a pair of semicircular grooves 47 and 49, and a circular hole 48 which is transversely disposed to face 41 and in intersecting relationship with semicircular grooves or channels 47, 49.

In FIG. 5, a plurality of sectioned pieces 50 for bonding into a 3-2 piezoelectric ceramic composite is shown. These pieces are a pair of end pieces 51 and a pair of inner pieces 52.

End pieces 51 have side faces 53, top and bottom faces 54, inner faces 55, and semicircular grooves 56. Inner pieces 52 have inner faces 58 and semicircular grooves 59. When the inner and end pieces are bonded, either with a suitable cement or by thermally self-bonding along faces 55, 58, the grooves 56/59, 59/59, and 59/56 form a circular hole in each instance. A cross-cored hole 57, transversely disposed to faces 53, 55, 58, and intersecting each half hole 56, 59, completes the transformation of section pieces or subunits 50 into a cross-cored and arrayed-hole 3-2 piezoelectric ceramic composite, as shown in FIG. 2. However, these semicircularly grooved elements, after being adhesively bonded together into such a cored rectangular array and sintered to provide a multicore 3-2 type composite sensor, have FOM values that are about ⅔ of those corresponding to unbonded 3-2 composites. Nevertheless, in view of the high FOM of the latter composites, these values may be fully adequate for many uses.

In FIG. 6, mold 60, shown in sectional elevation, comprises a top die 61, a mold frame 62, and a bottom die 63. Dies 61 and 63 fit and slide within mold frame 62. A pin 64 is rigidly attached to bottom die 63 and fits slideably within a blind cavity within top die 61. A raised semicylindrical ridge 65 is transversely disposed in the molding face of top die 61, and another such ridge 66 is in the molding face of bottom die 63. The ridges 65 and 66 form the pair of semicircular holes 47 and 49 in composite 40.

FIG. 7 shows a die 70 comprising side faces 71, 73 and a molding face 75 on which are a pair of crossed semicylindrical projections 77, 79.

FIG. 8a shows a piezoelectric ceramic composite 80 having side faces 81, 83 and a bond face 85 which bisects the crossed semicircular grooves 87, 89. When a pair of pieces 80 are bonded together along their faces 85 and then sintered to form a mated cross-cored piezoelectric ceramic composite 100 in cubelet form which is similar to composite 10 shown in FIG. 1, holes 87, 89 functioning similarly to holes 17, 19. However, the FOM values are lower than the FOM values for unitary composite 10.

Lattice 90, depicted in FIG. 9a, comprises a frame 91, a bottom, and a plurality of rectangularly intersecting plates 93 which define an array of cavities having the dimensions of selected cubelets 10, 20, 50, 100 of uniform size. The cavities may be disposed in a 4×4 or a 5×5 arrangement or any other larger or smaller square or rectangular arrangement that is useful in a hydrophone assembly.

The lattice 90 depicted in FIG. 9a is provided in order to:

(1) facilitate the assembly of an array of cubelets 10, 20, 50, 100, and (2) seal off internal volume that is present in cubelets that have not been backfilled with polymer.

Using lattice 90, cubelets can be arranged in precision arrays by simply inserting the cubelets in the cavities of the lattice, as seen in FIG. 9b. This eliminates the need to:

(1) manually arrange the cubelets in a precision array,
(2) embed the array in liquid polymer resin, and
(3) cure the polymer in place.

Lattice 90 can be fabricated from a variety of engineering resins, especially thermocasting resins that have been designed for precision injection molding. Especially preferred are polymers that yield stiff plastics. These polymers include polyacetals, nylons, and polyacrylates.

The cavities in lattice 90 are designed to accept cubelets 10, 20, 50, 100 with a snug fit in order that the cubelet/lattice ensemble can be handled in subsequent fabrication steps as a unit. As shown in FIG. 9b, cubelets 10, for example, can be rapidly placed in the snug-fitting cavities of lattice 90, until it is completely filled therewith, so that a precision array is automatically created.

An adhesive layer can be applied to contacting surfaces of cubelet and lattice in order to promote bonding and sealing of the cubelets in the lattice. This is particularly useful when a cubelet contains unfilled internal volume.

The cubelet/lattice ensemble 95 is then electroded and poled in an electric field and encapsulated in polymer, having a resin top surface 98 as seen in FIG. 9c, and is finally fitted with electrode leads and other structural or electrical components (not shown in the drawings) so that it can be incorporated in a hydrophone assembly as a permanent component thereof.

The process may be more thoroughly understood by reference to the following examples.

EXAMPLE 1

A dispersion of lead zirconate titanate (PZT) ceramic in a 3 vol. % aqueous PVA solution was prepared by dissolving 0.4 grams PVA into about 100 cc distilled water at 80° C. and adding 80 grams PZT to the aqueous PVA solution and then diluting to 500 cc with distilled water. The PZT was of type 501A supplied by Ultrasonic Powders, Inc., South Plainfield, N.J. A PVA solution at the 6 vol. % level was similarly prepared by dissolving 0.8 grams PVA in 100 cc of distilled water at 80° C. and adding 80 grams PZT and then diluting to a total of 600 cc.

A spray dryer (Büchi Model 190) having a heater, an air supply, and an aspirator was adjusted to provide a desired pump speed and an outlet temperature of 120° C. The 3% PVA/PZT solution was spray dried until 46 grams of 3% PVA/PZT composite powder were collected. The 6% PVA/PZT solution was spray dried until 42 grams of 6% PVA/PZT composite powder were collected.

EXAMPLE 2

Mold cavity 39 in mold 30 was charged with 1.8 grams of the 6% PVA/PZT composite powder and the dies were set so that pressure would be exerted simultaneously from top and bottom of the charge. The mold was placed in a manual Carver Press, model B, having 6 inch by 6 inch platens. About 6,500 lbs. of pressure were applied to the charge of 1.8 grams. The result was a cubelet measuring 7.5 mm×7.5 mm× approximately 9.15 mm.

EXAMPLE 3

The 6% PVA/PZT powder was again tested by loading 1.6 grams into mold cavity 39 and applying 6,500 lbs. of pressure thereto. The resulting cubelet measured 7.5 mm×7.5 mm×8.3 mm.

EXAMPLE 4

The 6% PVA/PZT powder was further tested by loading 1.4 grams into mold cavity 39 and applying 6,500 lbs. pressure thereto. The resulting cubelet measured 7.5 mm×7.5 mm×7.64 mm.

EXAMPLE 5

The 3% PVA/PZT composite powder was tested by loading 1.42 grams into mold cavity 39 and applying 7,500 lbs. pressure thereto. The resulting cubelet broke easily.

EXAMPLE 6

The 3% PVA/PZT powder was again tested by adding 1.40 grams to mold cavity 39 and applying 6,500 lbs. pressure thereto. The resulting cubelet measured 7.5 mm×7.5 mm×7.58 mm.

EXAMPLE 7

The 3% PVA/PZT powder was further tested by adding 1.38 grams to mold cavity 39 and applying 6,500 lbs. pressure thereto. The resulting cubelet measured 7.5 mm×7.5 mm×7.56 mm.

EXAMPLE 8

The PZT-574 powder was tested without polymer or binder, in an attempt to make a neat cubelet, by charging 1.38 grams thereof to mold cavity 39 and applying about 6,800 lbs. pressure thereto. The resulting cubelet was broken with a crack at its side hole. Problems were also encountered with release thereof from bottom die 35 and pin/plunger 34. Several additional runs gave confirming results.

EXAMPLES 9-14

The 6% PVA/PZT powder was used by charging 1.36 grams into mold cavity 39, after slight modification thereof, and cold pressing at a gauge pressure of about 6,500 lbs. The resultant cubes for the six experiments shown in Table I for Examples 9-14 have their long dimensions in centimeters, the other two dimensions of the cubelet remaining relatively constant at 0.724 centimeters and 0.726 centimeters. The average density was 5.073 g/cm$^3$.

EXAMPLES 15-20

The 3% PVA/PZT powder was used by charging 1.38 grams into modified mold cavity 39 and cold pressing at 6,500 lbs. gauge. The results are also shown in Table I. The average density was 5.061 g/cm$^3$.

TABLE I

| Example No. | Long Dimension, cm | Volume, cc | Weight, g | Density, g/cm³ |
|---|---|---|---|---|
| 9 | 0.752 | 0.250 | 1.2352 | 4.941 |
| 10 | 0.764 | 0.257 | 1.3002 | 5.059 |
| 11 | 0.784 | 0.267 | 1.4049 | 5.262 |
| 12 | 0.751 | 0.250 | 1.2355 | 4.942 |
| 13 | 0.765 | 0.257 | 1.3168 | 5.124 |
| 14 | 0.763 | 0.256 | 1.3076 | 5.108 |
| 15 | 0.759 | 0.254 | 1.2890 | 5.095 |
| 16 | 0.761 | 0.253 | 1.2671 | 5.008 |
| 17 | 0.761 | 0.255 | 1.2762 | 5.005 |
| 18 | 0.760 | 0.255 | 1.2872 | 5.048 |
| 19 | 0.764 | 0.257 | 1.300 | 5.058 |
| 20 | 0.775 | 0.263 | 1.3602 | 5.172 |

EXAMPLE 21

The cubelets of Examples 9-20 were placed on a platinum sheet, and the PVA binder was burned out at 550° C. for one hour. Sintering was then carried out in a sealed alumina crucible using a silicon carbide resistance furnace at a heating rate of 200° C. per hour with a soak period of one hour at 1285° C. while the PbO-rich atmosphere was maintained by use of sacrificial ceramic pellets composed of 97 mole % PZT and 3 mole % PbO inside the crucible, in order to avoid loss of lead from the molded pieces during sintering.

After firing and cooling, the holes of the cubelets were filled with a liquid epoxy resin (e.g. Eccogel ™ made by Emerson & Corning Co.) and cured according to manufacturer's specifications, thus completing the fabrication of the "3-2" composite. After that, air-dryable silver paste electrodes were applied to the two non-perforated sides of the cubelets, which were then poled in a stirred oil bath at 120° C. at a field of 25 KV/cm for 30 minutes in order to permanently polarize the ceramic.

The measured dielectric relative permittivities K, the piezoelectric charge coefficients $d_{33}$ and $d_h$, and the piezoelectric hydrostatic voltage coefficient $g_h$ of samples averaged over two or three typical specimens are given in Table II. Also listed in Table II are the hydrostatic Figure of Merit (FOM) values calculated as the product $d_h g_h$. Also included for comparison are typical values of piezoelectric monolithic state-of-art PZT ceramic pieces of comparable dimensions. The resulting enhancement of the FOM is quite evident.

TABLE II

| Origin of PZT* | K Units: | $d_{33}$ ($10^{-12}$ C/N) | $d_h$ ($10^{-12}$ C/N) | $g_{33}$ ($10^{-3}$ Vm/N) | $g_h$ ($10^{-3}$ Vm/N) | FOM ($10^{-15}$ M²/N) |
|---|---|---|---|---|---|---|
| Composite: | | | | | | |
| Lot 570 | 600 | 310 | 165 | 58 | 30 | 4950 |
| Lot 574 | 550 | 270 | 95 | 55 | 20 | 1900 |
| Neat PZT: | | | | | | |
| Lot 570 | 1600 | 400 | 60 | 25 | 2.5 | 150 |

*Supplied by Ultrasonic Powders, Inc., South Plainfield, N.J.
Both lots consist of type 501A PZT powder.

Because it will be readily apparent to those skilled in the molding art that innumerable variations, modifications, applications, and extensions of the examples and principles hereinbefore set forth can be made without departing from the spirit and the scope of the invention, what is here intended and defined as such scope and is desired to be protected should be measured, and the invention should be limited, only by the following claims.

What is claimed is:

1. In the fabrication of a hydrophone assembly, wherein a plurality of selected cubelets, molded from a piezoelectrically active ceramic material, must be arranged in a precision array and embedded in a liquid polymer resin which is then cured with the array in place,
    a cubelet/lattice assembly as an improvement for facilitating said arranging and embedding, comprising:
    A. a plurality of said cubelets; and
    B. a lattice comprising a frame, a bottom, and a plurality of intersecting plates which define a precision array of snug-fitting cavities having the dimensions of said cubelets, wherein:
       (1) said frame, said bottom, and said plates are fabricated from an engineering resin yielding a stiff plastic, and
       (2) said engineering resin is a thermocasting resin suitable for precision injection molding, said resin being a polymer selected from the group consisting of polyacetals, nylons, and polyacrylates.

2. The cubelet/lattice assembly of claim 1, wherein said cubelet/lattice assembly is electroded and poled in an electric field, encapsulated in polymer to form a resin top surface, fitted with electrode leads, and then incorporated into said hydrophone assembly.

3. The cubelet/lattice assembly of claim 1, wherein said array is a 16-element array.

4. The cubelet/lattice assembly of claim 1, wherein said array is a 25-element array.

5. The cubelet/lattice assembly of claim 1, wherein said cubelets are selectively cored, forming holes having internal volumes that are sealed off by said lattice.

6. The cubelet/lattice assembly of claim 5, wherein said holes in said cored cubelets are filled with a cured liquid resin.

7. The cubelet/lattice assembly of claim 6, wherein said resin is an epoxy resin.

8. The cubelet/lattice assembly of claim 5, wherein said cubelets are formed from subunits having half holes.

9. The cubelet/lattice assembly of claim 8, wherein said subunits are conjoined by fusing at an elevated sintering temperature.

10. The cubelet/lattice assembly of claim 8, said subunits being conjoined by bonding with an adhesive.

11. The cubelet/lattice assembly of claim 5, wherein said lattice seals off unfilled internal cubelet volume within said holes.

12. The cubelet/lattice assembly of claim 11, wherein said cubelets are adhesively bonded to the sides and bottoms of said cavities.

13. The cubelet/lattice assembly of claim 5, wherein said hydrophone assembly has hydrophone Figure-of-Merit values exceeding 4,000 $10^{-15}$ m²/N.

14. A device for facilitating the fabrication of a hydrophone assembly, comprising:
  A. a means for facilitating the arranging and embedding of a plurality of cored cubelets in a precision array during said fabrication, each said cubelet having an unfilled internal cubelet volume; and
  B. a means for excluding fluid from each said internal volume.

15. The device of claim 14, wherein said facilitating means is a lattice having a plurality of cavities, comprising:
  A. a frame;
  B. a bottom; and
  C. a plurality of intersecting plates which define a precision array of snug-fitting cavities having the dimensions of said cubelets, wherein:
    (1) said frame, said bottom, and said plates are fabricated from an engineering resin yielding a stiff plastic, and
    (2) said engineering resin is thermocasting resin suitable for precision injection molding, said resin being a polymer selected from the group consisting of polyacetals, nylons, and polyacrylates,
  whereby snugness of fit of said cavities with said cubelets provides said fluid excluding means.

* * * * *